(12) United States Patent
Carr et al.

(10) Patent No.: US 6,192,563 B1
(45) Date of Patent: Feb. 27, 2001

(54) APPARATUS HAVING IMPROVED CYCLE TIME FOR REMOVING A PC BOARD FROM A PANEL

(75) Inventors: Douglas Patrick Carr, Boulder; Kurt John Hill, Berthoud, both of CO (US)

(73) Assignee: PMJ Cencorp LLC, Longmont, CO (US)

( * ) Notice: Subject to any disclaimer, the term of this patent is extended or adjusted under 35 U.S.C. 154(b) by 0 days.

(21) Appl. No.: 09/033,038

(22) Filed: Mar. 2, 1998

(51) Int. Cl.[7] ................................................ B23Q 7/00
(52) U.S. Cl. ................... 29/33 P; 29/563; 29/564; 29/711; 409/132; 409/164
(58) Field of Search .................... 29/33 P, 566.1, 29/563, 564, 711, 762; 409/131, 132, 163, 164

(56) References Cited

U.S. PATENT DOCUMENTS

| | | | |
|---|---|---|---|
| 3,887,999 | * | 6/1975 | Ross et al. ............................ 29/628 |
| 4,981,092 | * | 1/1991 | Bauman et al. ..................... 112/103 |
| 4,985,982 | * | 1/1991 | Lohr et al. ...................... 29/556.001 |
| 5,067,229 | * | 11/1991 | Nakamura .......................... 29/566.1 |
| 5,117,554 | * | 6/1992 | Grabow ................................. 29/791 |
| 5,205,026 | * | 4/1993 | Sticht ................................... 29/33 P |
| 5,210,922 | * | 5/1993 | Carr .................................... 29/426.3 |
| 5,429,461 | * | 7/1995 | Mukherjee et al. ................. 409/163 |
| 5,438,740 | * | 8/1995 | Carr et al. ........................... 29/33 P |
| 5,558,784 | * | 9/1996 | Obrist .............................. 219/69.12 |
| 5,894,648 | * | 4/1999 | Hill et al. ............................ 29/33 P |

* cited by examiner

Primary Examiner—Lee Young
Assistant Examiner—A. Dexter Tugbang
(74) Attorney, Agent, or Firm—Duft, Graziano & Forest, P.C.

(57) ABSTRACT

A system having improved cycle time for removing PC boards from a connected panel. In accordance with the present invention, a pair of walking clamps are used to receive a panel from a subsequent processing system, and a movable receiving nest is used to provide the PC boards to a subsequent processing station. The processes of receiving a panel, depaneling the PC board, and delivering the PC boards do not use common components and are able to operate independently and concurrently to reduce idle time in the system and improve the cycle time. The present invention also provides a secondary vacuums which removes debris from the PC boards as the PC boards are being transporting to a subsequent processing system to improve the removal of debris.

4 Claims, 7 Drawing Sheets

APPARATUS HAVING IMPROVED CYCLE TIME FOR REMOVING A PC BOARD FROM A PANEL

FIELD OF THE INVENTION

The present invention relates to removing PC boards from a panel containing the PC boards. More particularly, the present invention relates to providing systems for receiving the panel from a feeder system, for depaneling the PC boards, and delivering the PC boards to a subsequent processing system that operate concurrently. The present invention also relates to providing a secondary vacuum to remove debris from the PC boards as the PC boards are delivered to the subsequent processing station.

PROBLEM

In today's society, most electronic devices, such as televisions and telephones, have at least one printed circuit board ("PC board") in their circuitry. As the use of PC boards in electronic devices has increased, it has become necessary to be able to mass produce PC boards in order to mass produce the electronic equipment. A common method in the mass production of PC boards is to assemble multiple PC boards at one time in a single panel. By using a single panel, assembly equipment only has to manipulate a single panel to operate on multiple PC boards. This simplifies the processes required to produce the PC boards and reduces the time needed to produce each PC board.

Mass production of PC boards in a single panel requires that each individual PC board must be removed or depaneled from the panel before the individual PC boards can be integrated into the electronic equipment. The time needed to depanel individual PC boards from a panel is a critical factor in the production time of PC boards. In order to decrease the time needed to produce a PC board as well as electronic equipment, it is necessary to reduce the time needed to depanel individual PC boards from a panel.

In order to depanel PC boards from a panel, all connections between each individual PC board and the panel must be severed. Automated depaneling systems are commonly used to sever all of the connections between the individual PC boards and a panel. The individual PC boards are then moved by the automated depaneling system to a subsequent processing system or to a registration element which provides the individual PC boards to the subsequent processing system. It is a problem to reduce the time needed to depanel all of the individual circuit boards from a panel.

Depaneling individual PC boards from a panel of PC boards typically involves three separate processes in a depaneling system. The three processes are delivery of a panel, depaneling individual PC boards from the panel, and providing the individual PC boards to a subsequent processing system. In a typical depaneling system, the three processes occur sequentially. First, the panel is delivered to the depaneling system. Second, the individual PC boards are depaneled. Finally, the individual PC boards are provided to a subsequent processing system.

These three operations must be done sequentially because of the physical constraints of the depaneling system. A depaneling system typically includes a table, a router and a robotic arm. A panel is received by the system and placed on the table in a preprogramed or registered position. A robotic hand at an end of the robotic arm grips each individual PC board in the panel. The router or some other cutting equipment then severs all of the connections between each PC board and the panel. After all of the connections are severed, the robotic arm moves the individual PC boards to a registration nest or a subsequent processing system. The depaneling system is not ready to receive a subsequent panel until the robotic arm returns and is able to hold the PC boards from the new panel.

There is a long felt need in the art for a depaneling system having improved cycle time to increase the number of circuit boards per unit of time produced. This can be achieved by decreasing the idle time of a panel delivery system, a depaneling system, and a system for transporting the PC boards to a subsequent processing system. One possible method of decreasing the idle time of the depaneling system is to provide three processes that can operate concurrently. In order to perform the operations concurrently, it is necessary to provide a automated depaneling system in which each process can operate independently from the other processes.

A second problem in depaneling systems is defective PC boards caused by the ineffective removal of excess debris from the PC boards. Debris remaining on a PC board can cause a short in the circuitry of the board or other elements of a circuit containing the PC board or can cause misalignment of the PC board with connectors inside a device. The excess debris must be removed to prevent such defects.

One method for removing excess debris is to remove the debris using a vacuum during the severing of connections between the PC board and the panel. As of the connections between the individual PC boards and a panel are being severed by the depaneling system, a vacuum inside the depaneling is then moved across the PC boards. Excess debris remaining on the PC boards is removed by the vacuum. However, the vacuum is not always successful in removing all of the excess debris from the PC board. One reason for the ineffectiveness of the vacuum is the physical constraints of the depaneling system which may prohibit the movement of the vacuum across the entirety of each individual PC board. There is a need for a method for improving the removal of excess debris from PC boards removed from a panel.

SOLUTION

The above and other problems are solved and an advance in the arts is made by the provision of a depaneling system having walking clamps for receiving a panel from a feeder system; a movable registration nest for removing individual PC boards from a depaneling subsystem and for providing the PC board to a subsequent processing system; and a secondary vacuum for removing excess debris from PC boards removed from the depaneler. Cycle time of a automated depaneling system and removal of excess waste from PC boards is improved by the present invention. In accordance with the present invention, a subsystem for receiving a panel from a feeder, the depaneling subsystem for removing the PC boards from the panel, and a subsystem for removing the PC boards from the depaneler and providing the boards to a subsequent processing system may operate independently. This improves cycle time since each subsystem may perform its function concurrently with the other two subsystems and idle time of each subsystem is reduced. The three subsystems are able to operate concurrently because the three subsystems do not share common elements. A first subsystem does not have to wait for a common element in a second subsystem to complete a task before the common element is available to perform a task in the first system. Additionally, the present invention provides a secondary vacuum to remove excess debris from a PC board after the PC board has been removed from a panel.

In accordance with the present invention, a subsystem for receiving a panel in a depaneling system is provided by a pair of walking clamps. A first walking clamp and a second walking clamp are juxtaposed to each other and are spaced apart to allow the first walking clamp to clamp to a first side of a panel and the second walking clamp to clamp to a second side of the panel. A pneumatic motor moves the first and the second walking clamps linearly along a defined path between a feeder system and a depaneler.

The first walking clamp starts in a first position proximate the feeder system such as a cartridge, and clamps a first corner on a first side of a panel from the feeder system. The pneumatic motor moves the first walking clamp toward the depaneler to a second position pulling the panel out of the cartridge. The second walking clamp starts in a first position along a second side the panel when the first walking clamp is in the second position and clamps the second side of the panel. The first walking clamp releases the first corner of the panel after the second walking clamp has clamped the second side of the panel. The second walking clamp is then moved toward the depaneler to a second position proximate the depaneler. The first walking clamp is then moved toward the depaneler to a position along the first side of the panel across from the second walking clamp and clamps the first side of the panel. The panel is held in place by the first and second walking clamps until the depaneling system is in a ready state to receive the panel from the walking clamps.

When the depaneling system is in a ready state, the first walking clamp releases the first side of the panel and moves to the first position to receive a subsequent panel. A third walking clamp from inside the depaneling system is moved along the first side of the panel, and clamps the first side of the panel. Sensors on the third walking clamp are used to adjust the position of the panel and to register the position of the panel for the depaneling subsystem. The third clamp moves the panel into the depaneler which removes the PC boards from the panel. The second walking clamp releases the second side of the panel when the third walking clamp from the depaneling system clamps the first side of the panel and moves to the first position of the second walking clamp to clamp to a subsequent panel.

The depaneling subsystem of the present invention depanels the PC boards in the following manner. The third walking clamp moves the panel into a proper position in the depaneling subsystem. The panel is held in place by the third walking clamp and a clamp on the opposing side of the panel. A robotic hand attached to a robotic arm grips each PC board in the panel. A router then severs all of the connections between the PC boards and the panels allowing debris to fall away from the PC boards as the PC boards are held in place by the robotic hand. A primary vacuum in the depaneling subsystem removes excess debris from the PC boards as the router severs the connections.

After each PC board has been depaneled from a panel, the PC boards must be removed from the depaneling subsystem and provided to a subsequent processing system. In accordance with the present invention, a movable receiving nest removes the PC boards from the depaneler and provides the depaneled PC boards to a subsequent processing system. The movable receiving nest receives the PC boards in the depaneling subsystem instead of having the robotic arm move the PC boards to a receiving nest outside the depaneling system. This allows the depaneling subsystem to receive a subsequent board after the movable nest receives the PC boards.

The movable receiving nest operates in the following manner. After all of the connections between the panel and PC boards have been severed, the movable receiving nest is moved to a first position under the severed PC boards in the depaneling subsystem by a servo motor. The robotic hand then places each PC board into a separate compartment in the movable receiving nest. The servo motor then moves the movable receiving nest from the first position to a second position outside of the depaneling subsystem. A subsequent processing system then retrieves the PC boards from the movable receiving nest at the second position.

As the movable receiving nest is being moved from the first position to the second position, a secondary vacuum removes excess debris from the PC boards. A secondary vacuum is positioned over a path of the movable receiving nest between the first and second positions. As the movable receiving nest moves from the first to the second position, the movable receiving nest moves through a head of a the secondary vacuum. Any excess debris remaining on the PC boards is removed by the secondary vacuum.

These and other advantages of the present invention will be apparent to those skilled in the art upon a reading of the detailed description below in combination with the accompanying drawings.

DETAILED DESCRIPTION

Figure 1:
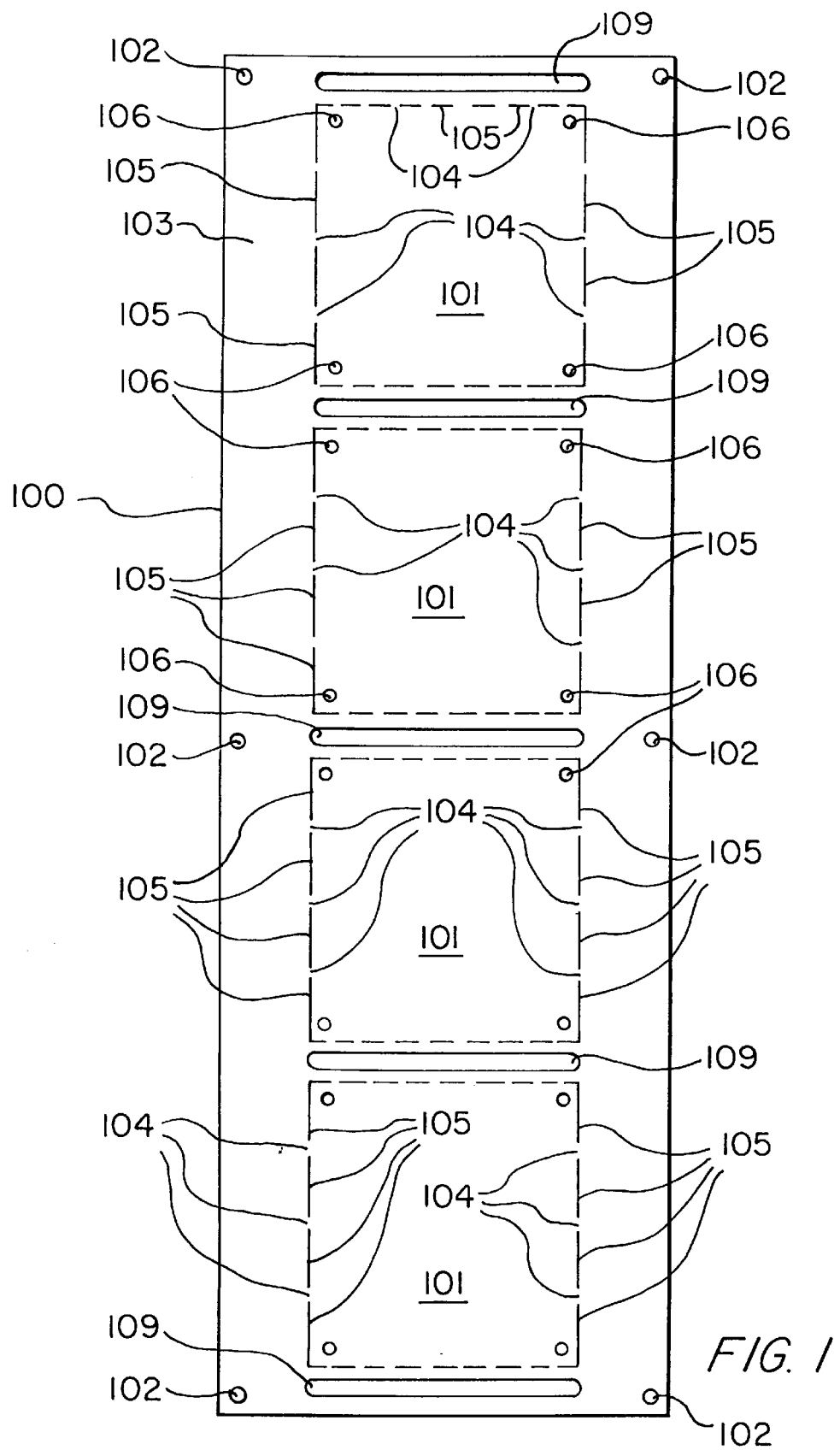
FIG. 1 illustrates a panel of PC boards.

Panel of PC Boards—FIG.1

FIG. 1 illustrates an exemplary panel 100 containing four PC boards 101. Panel 101 is representative of a panel used in the present invention and in no way limits the type of panel or PC board which may be depaneled by the present invention Slots 105 and tabs 104 define the edges of PC boards 101. Tabs 104 connect PC boards 101 to panel 100 and are cut during the depaneling process to liberate PC boards 101 from panel 100. Registration holes 106 in each PC board 101 are used to grip PC board 101 as described below. Frame 103 is the material of panel 100 that hold PC boards 101 together as one panel 100. Slots 109 define the edges of PC board 101 and are used by grippers in system 100 to hold PC boards 101. After tabs 104 are cut the material of frame 103 becomes debris. Although panel 100 is described with four panels 101, it is understood that panel 100 can have any number of PC boards that are arranged on panel 100 in any configuration. The actual number and configuration of PC boards 101 on panel 100 is a design choice left to the maker of the panel.

Figure 2:
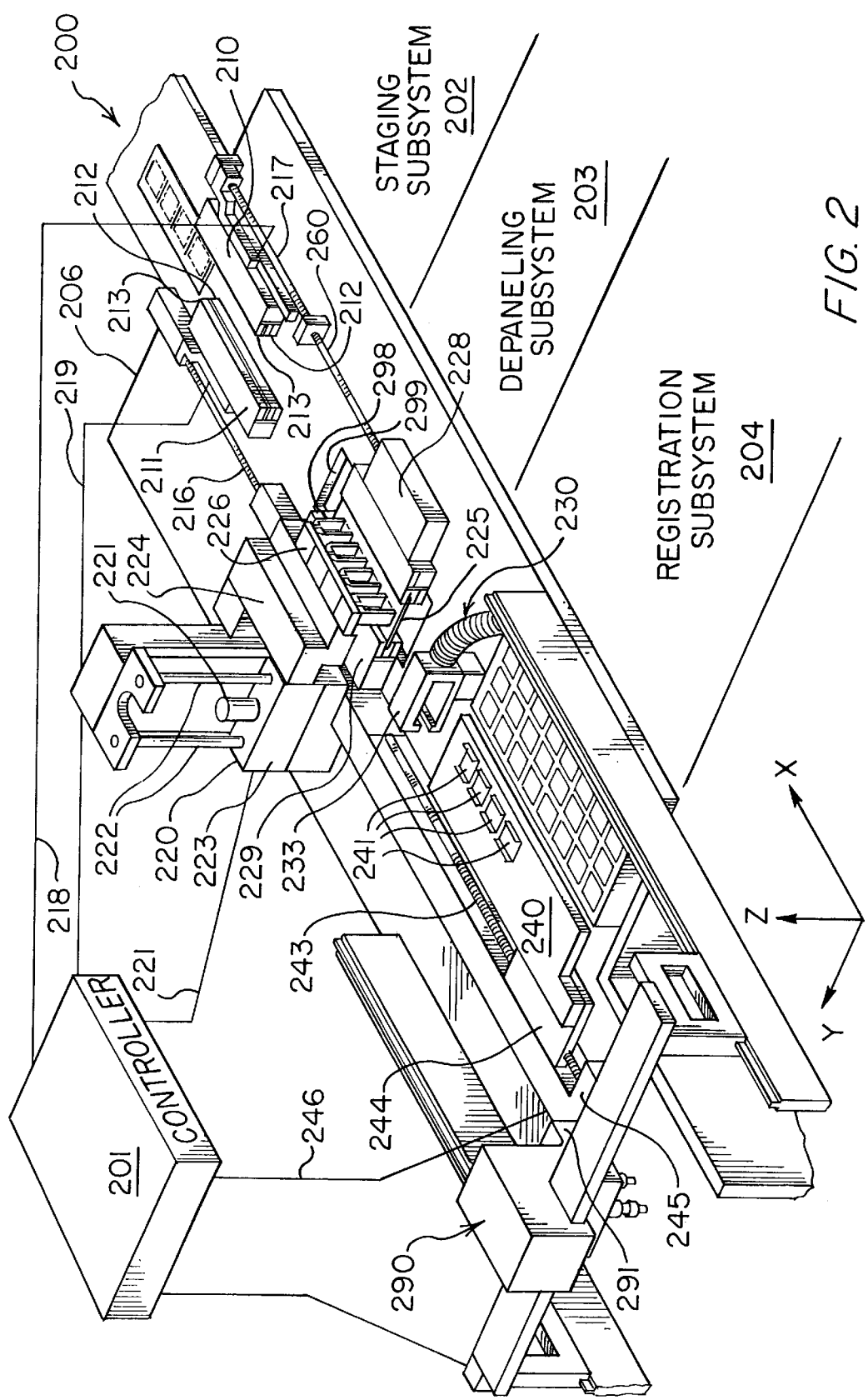
FIG. 2 illustrates a preferred exemplary embodiment of a depaneling system of the present invention.

A Preferred Exemplary Embodiment of a Depaneling System in Accordance With the Present Invention—FIG. 2

Figure 8:
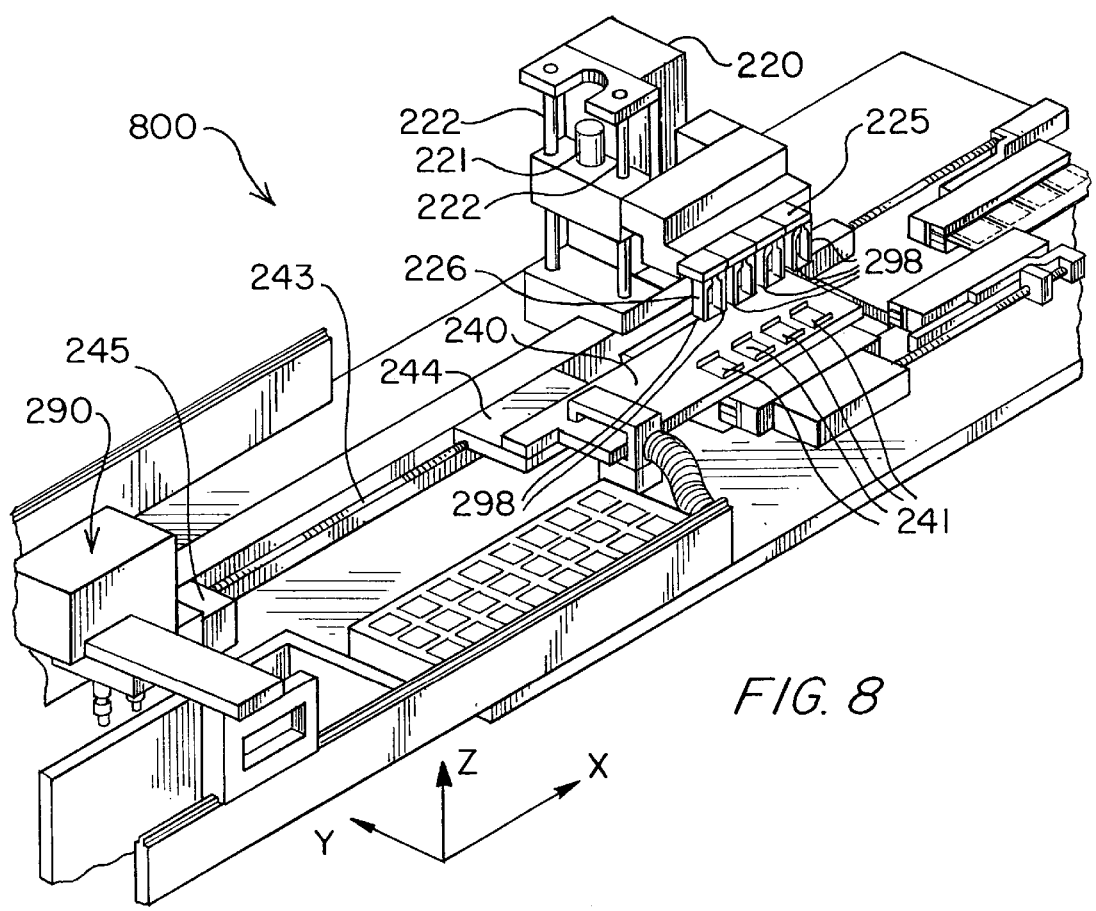
FIG. 8 illustrates a movable receiving nest in a position inside a depaneling subsystem.
Figure 9:
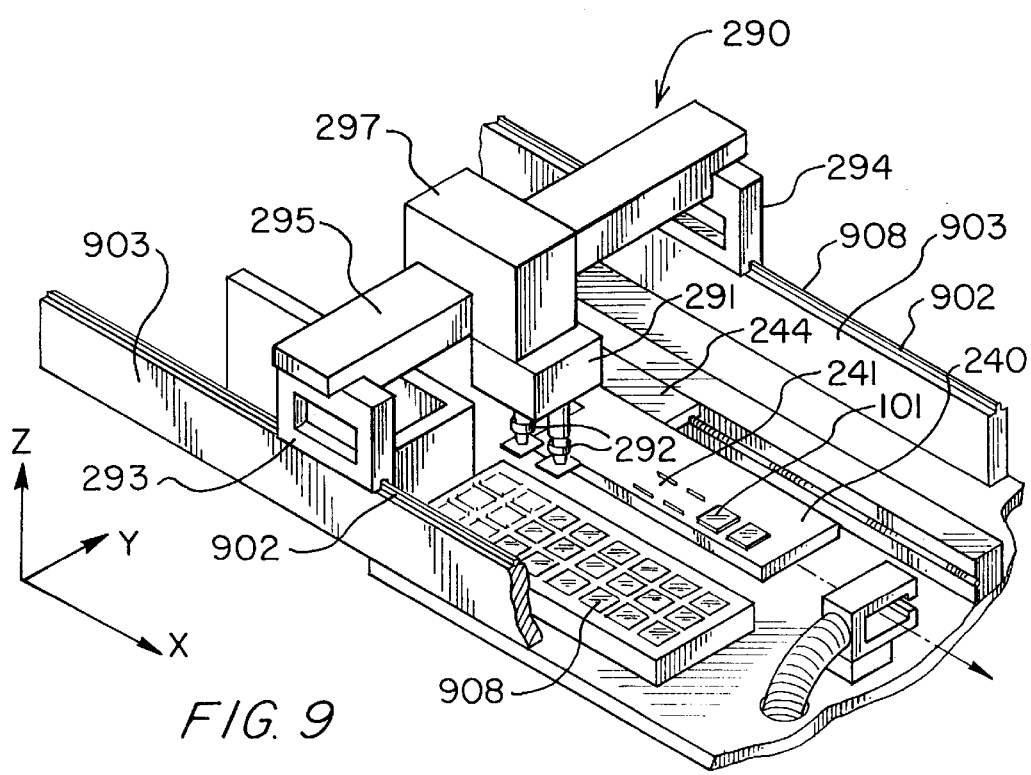
FIG. 9 illustrates a pick and place arm removing PC boards from the movable receiving nest inside a registration subsystem.

FIG. 2 illustrates an assembled view of all of the subsystems of depaneling system 200 on a table 206. FIGS. 3–9 illustrate isolated views of the subsystems of depaneling system 200 in accordance with the present invention. In general, depaneling system 200 operates in the following manner. A panel 100 is received by a staging subsystem 202 and delivered to a depaneling system 203 by a process described below and illustrated in FIGS. 3–6. Depaneling system 203 severs all of the connections between panel 100 and PC boards 101. Depaneling system 203 is described below and illustrated in FIG. 7. After all of the connections have been severed by depaneling system 203, movable receiving nest 240 receives PC boards 101 from depaneling system 203 and moves PC boards 101 to a registration subsystem 204. Movable receiving nest 240 is illustrated in FIG. 8 and the process for moving movable receiving nest 240 is described below. Registration subsystem 204 delivers PC boards 101 to a subsequent processing system (not shown). Registration subsystem 204 is illustrated in FIG. 9 and described below.

All of the processes performed by the subsystems of depaneling system 200 are controlled by controller 201. Controller 201 is a general purpose programmable computer such as an IBM personal computer capable of executing a series of instructions for operating each subsystem stored in a memory. Signals are transmitted between staging subsystem 202 and controller 201 via paths 218 and 219, between depaneling subsystem 203 and controller 201 via path 227, and between registration subsystem 204 and controller 201 via path 246.

Staging Subsystem 202—FIGS. 3–6

FIGS. 3–6 illustrate the various positions of the components of staging subsystem 202 during the process of receiving panel 100 from a previous processing system (not shown) and delivering panel 100 to depaneling subsystem 203. Unlike the prior art, subsystem 202 operates independently of depaneling subsystem 203. This allows staging subsystem 202 to be receiving and delivering another panel 100 as depaneling subsystem 200 is severing the connections between PC boards 101 and the prior panel 100.

As illustrated in FIG. 3–6, staging subsystem 202 is comprised of a first walking clamp 210 and a second walking clamp 211. Walking clamps 210 and 211 are juxtaposed from each other and are spaced so that a panel 100 fits between the clamps. A groove is defined between the upper clamping member 213 and the clamping 212 of each walking clamp 210–211. One side of panel 100 fits into the groove. Pneumatic motors (not shown) cause upper clamping member 213 and lower clamping member 212 to open and close in response to signals from controller 201 in order to clamp and release a panel 101.

First walking clamp 210 is slidably affixed to guide 217. A pneumatic motor (not shown) moves first walking clamp 210 along guide 217 in response to signals from controller 201. Second walking clamp 211 is slidably affixed to guide 216. A pneumatic motor (not shown) moves second walking clamp 212 along guide 216 in response to signals received from controller 201.

Figure 3:
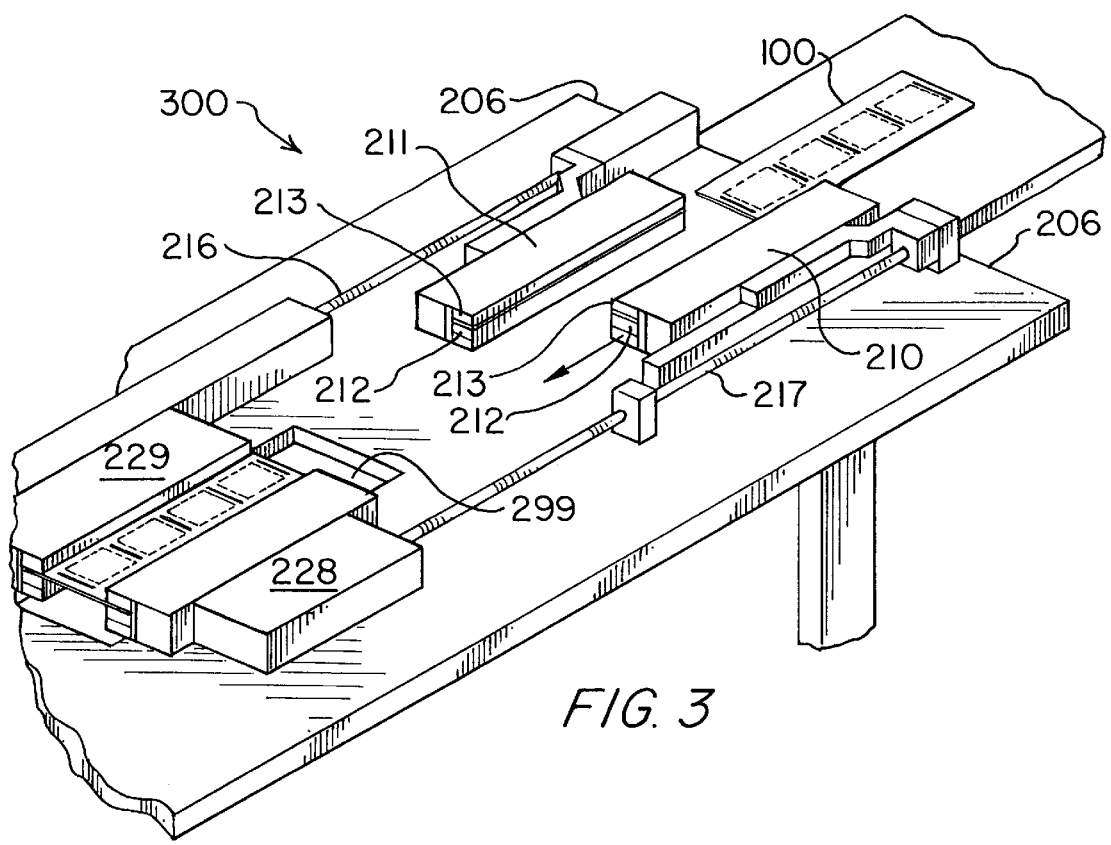
FIG. 3 illustrates a pair of walking clamps of the preferred exemplary embodiment in a first position.

FIGS. 3–6 illustrate the positions in which controller 201 places first walking clamp 210 and second walking clamp 211 to receive panel 101 and deliver panel 101 to depaneling subsystem 203. First, staging subsystem 202 must receive panel 101 from a previous processing station (not shown) such as a cartridge containing multiple panels 101 FIG. 3 illustrates the position 300 in which first and second clamping means are placed by controller 201 in order to receive panel 101.

In first position 300, first walking clamp 210 is at a first end of guide 217 and second walking clamp 211 is at a first end of guide 216. Guides 216 and guide 217 are near a first end of table 206. This allows first walking clamp 210 and second walking clamp 211 to overhang table 206. The previous processing station (not shown) positions panel 100 so that a first corner of a first side of panel 100 is inserted inside the groove of first walking clamp 210. Controller 201 then signals upper clamping member 213 and lower clamping member 212 of first walking clamp 210 to close and clamp panel 101.

Figure 4:
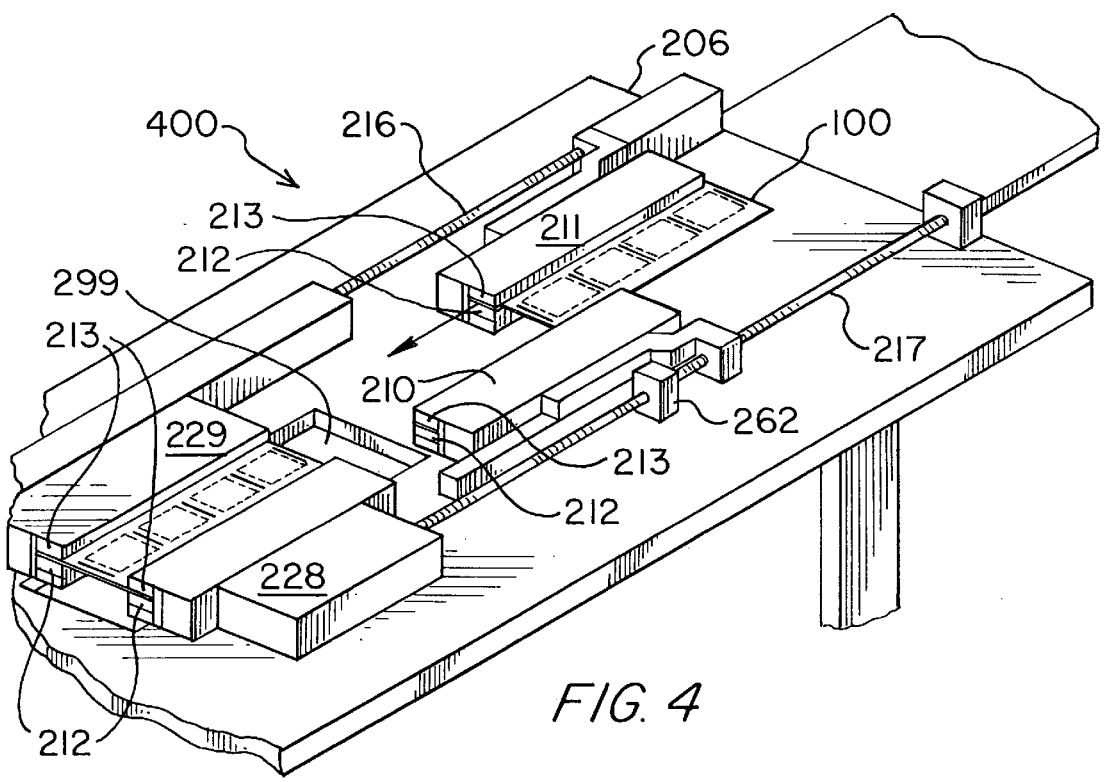
FIG. 4 illustrates the pair of walking clamps of the preferred exemplary embodiment in a second position.

FIG. 4 illustrates a second position 400 of staging system 202. Controller 201 signals the pneumatic motor (not shown) to move first walking clamp 210 along guide 217 to second position 400 after panel 101 has been clamped by first walking clamp 210. The moving of first walking clamp 210 causes panel 100 to move to a position where a second side of panel 100 is inside the grove of second walking clamp 211. After the second side of panel 100 is fully inside the grove of second walking clamp 211, controller 201 signals a pneumatic motor (not shown) to close upper clamping member 213 and lower clamping member 212 of second walking clamp 211 in order to clamp panel 100. Controller 201 then signals the upper and lower clamping members of first walking clamp 210 to open and release panel 101

Figure 5:
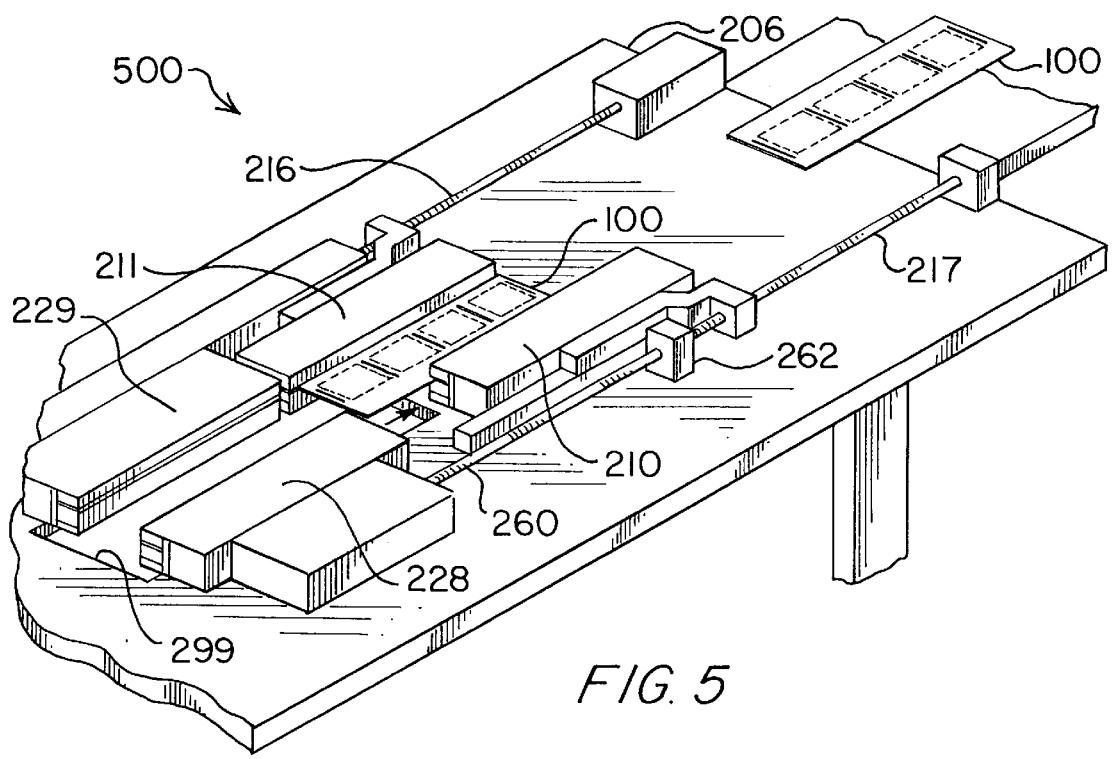
FIG. 5 illustrates the pair of walking clamps in a third position.

FIG. 5 illustrates a third position 500 of staging system 202. First walking clamp 210 and second walking clamp 211 are moved to third position 500 in response to second walking clamp clamping panel 100. After panel 100 is clamped by second walking clamp 211, controller 201 signals a pneumatic motor (not shown) to move second walking clamp 211 to a second end of guide 216. At the second end of guide 216, second walking clamp 211 is proximate depaneling subsystem 213. After second walking clamp 211 is moved, controller 201 signals the pneumatic motor (not shown) to move first walking clamp 210 to a second end of guide 217 as shown in FIG. 5. This places the first side of panel 100 inside the groove of first walking clamp 211. Controller 201 then signals a pneumatic motor (not shown) to close upper clamping member 213 and lowerclamping member 212 of first walking clamp 210 in order to clamp the first side of panel 100. First walking clamp 210 and second walking clamp 210 hold panel 100 in position 500 until depaneling subsystem 203 is ready for panel 100.

Figure 6:
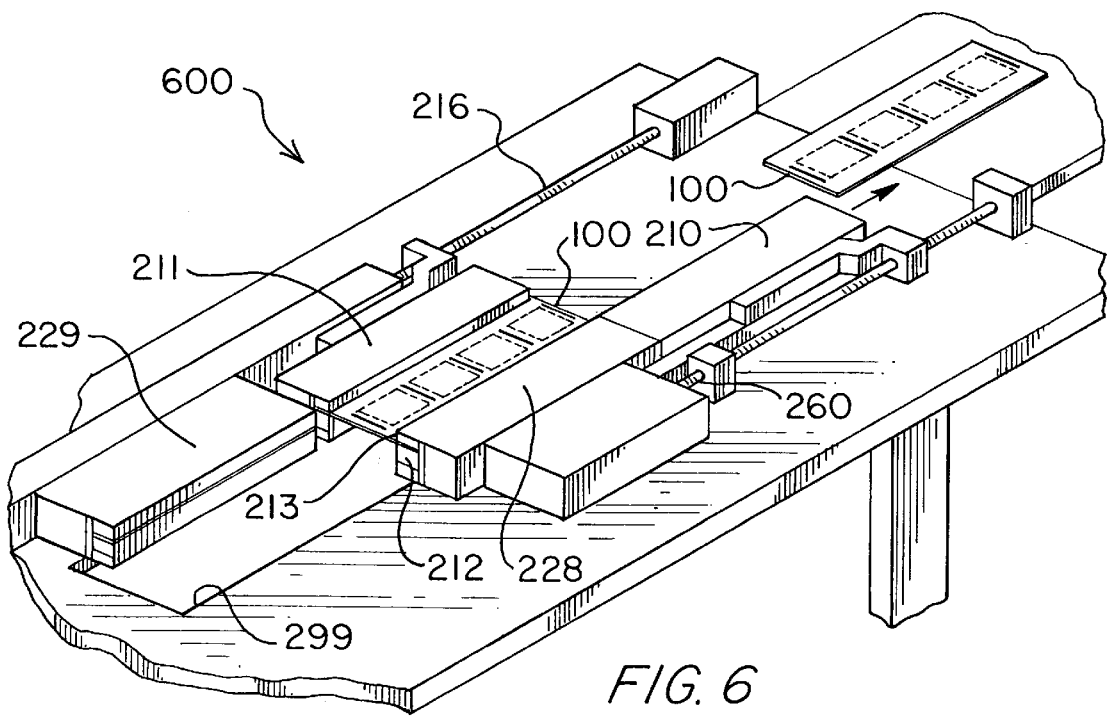
FIG. 6 illustrates a clamp from the depaneling area receiving a panel of PC boards.

When controller 201 receives a signal indicating that depaneling subsystem 203 is in ready state and able to receive another panel 100, controller 201 moves first walking clamp 210, second walking clamp 211, and third walking clamp 228 from depaneling subsystem 203 to position 600 illustrated in FIG. 6. First, controller 201 signals the pneumatic motors (not shown) to open upper clamping member 213 and lower clamping member 212 of first walking clamp 210 in order to release panel 100 and deenergizes the pneumatic motor (not shown) for moving first walking clamp 210. Signals are then sent to servo motor 262 to move the third walking clamp 228 along lead screw 260 to a first end of lead screw 260. As third wiking clamp 228 moves along side panel 100, first walking clamp 210 is displaced by third walking clamp 228 and moved to a first position along guide 217. When third walking clamp 228 is at the first end of lead screw 260, the first side of panel 100 is in the groove of third walking clamp 228. Controller 201 signals a pneumatic motor (not shown) to close upper clamping member 213 and lower clamping member 212 of third walking clamp 228.

Figure 10:
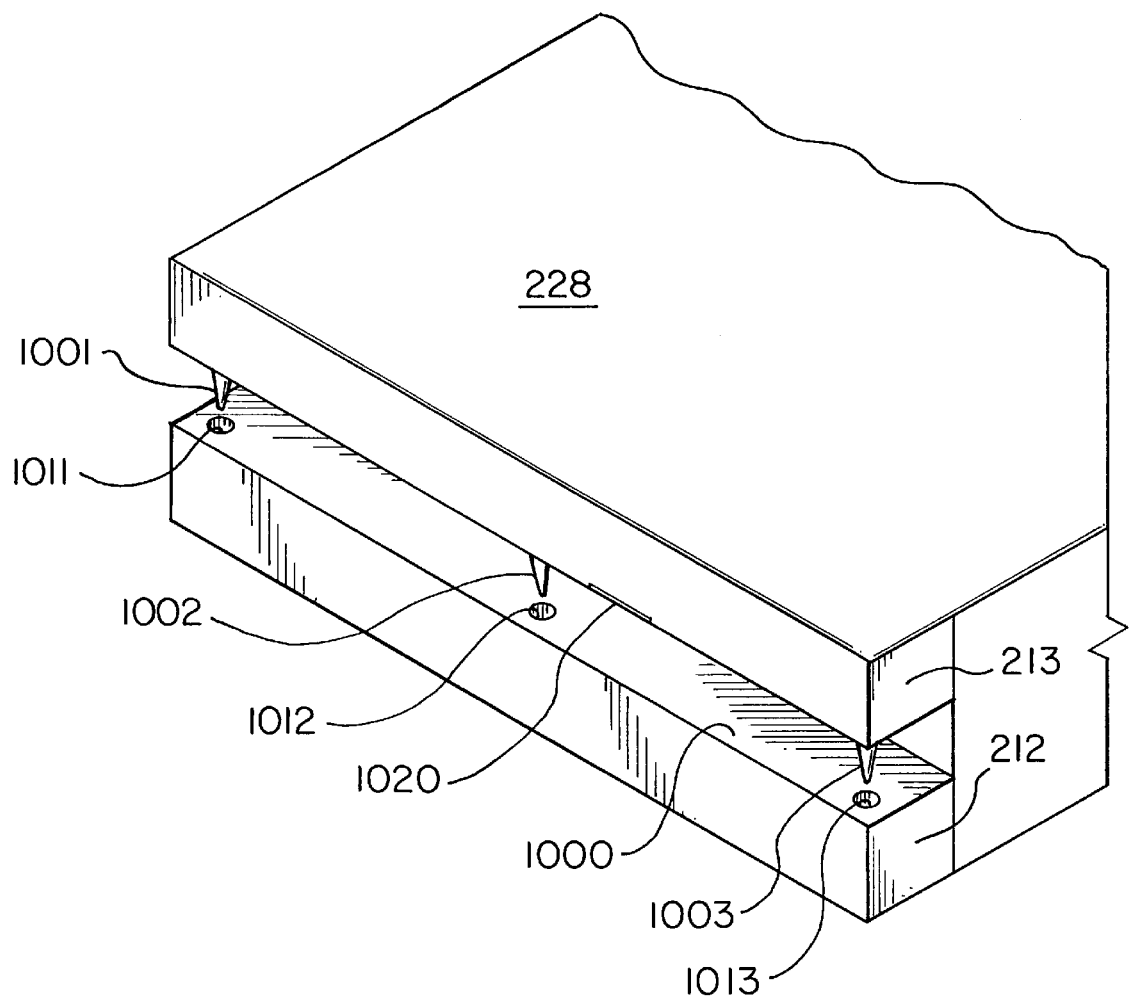
FIG. 10 illustrates the components of a walking clamp inside groove of a preferred exemplary embodiment.

After third walking clamp 228 is along side panel 100 and panel 100 is in the groove of walking clamp 228, a registration process is performed. FIG. 10 illustrates the components of walking clamp 228 inside groove 1000. As panel 100 slide inside groove 1000, optical sensor 1020 scans for a middle opening 102 in panel 100. After the middle opening 102 is sensed under optical sensor 1020, walking clamp 228 is moved in a programed motion in order to align middle registration pin 1002 and the middle opening 102 of panel 100. This also aligns registration pins 1001 and 1003 with openings 102 on opposing ends of panel 100. After registration pins 1001–1003 are aligned with openings 102, controller 201 signals a pneumatic motor to close upper clamping member 212 and lower clamping member 213. Registration pins 1001–1003 go through openings 102 and into receiving apertures 1011–1013 to hold panel 100 in a known position to allow depaneling subsystem 203 to sever the connections between panel 100 and PC boards 101.

After third walking clamp 228 clamps to panel 100, controller 201 then signals the pneumatic motors (not shown) to open upper clamping member 213 and lower clamping member 212 of second walking clamp 211 to release panel 100. After second walking clamp 211 has released panel 100, controller 201 signals the servo motor 261 to move third walking clamp 228 to a second end of lead screw 260 inside depaneling subsystem 203. This moves the second side of panel 100 into the groove of a clamp 229. A signal is then sent to pneumatic motor (not shown) to close upper clamping member 213 and lower clamping member 212 of clamp 229 in order to secure panel 100 in place during the depaneling process. Controller 201 then signals the pneumatic motor (not shown) to move second walking clamp 211 to a first end of guide 216 to wait for a subsequent panel.

Figure 7:
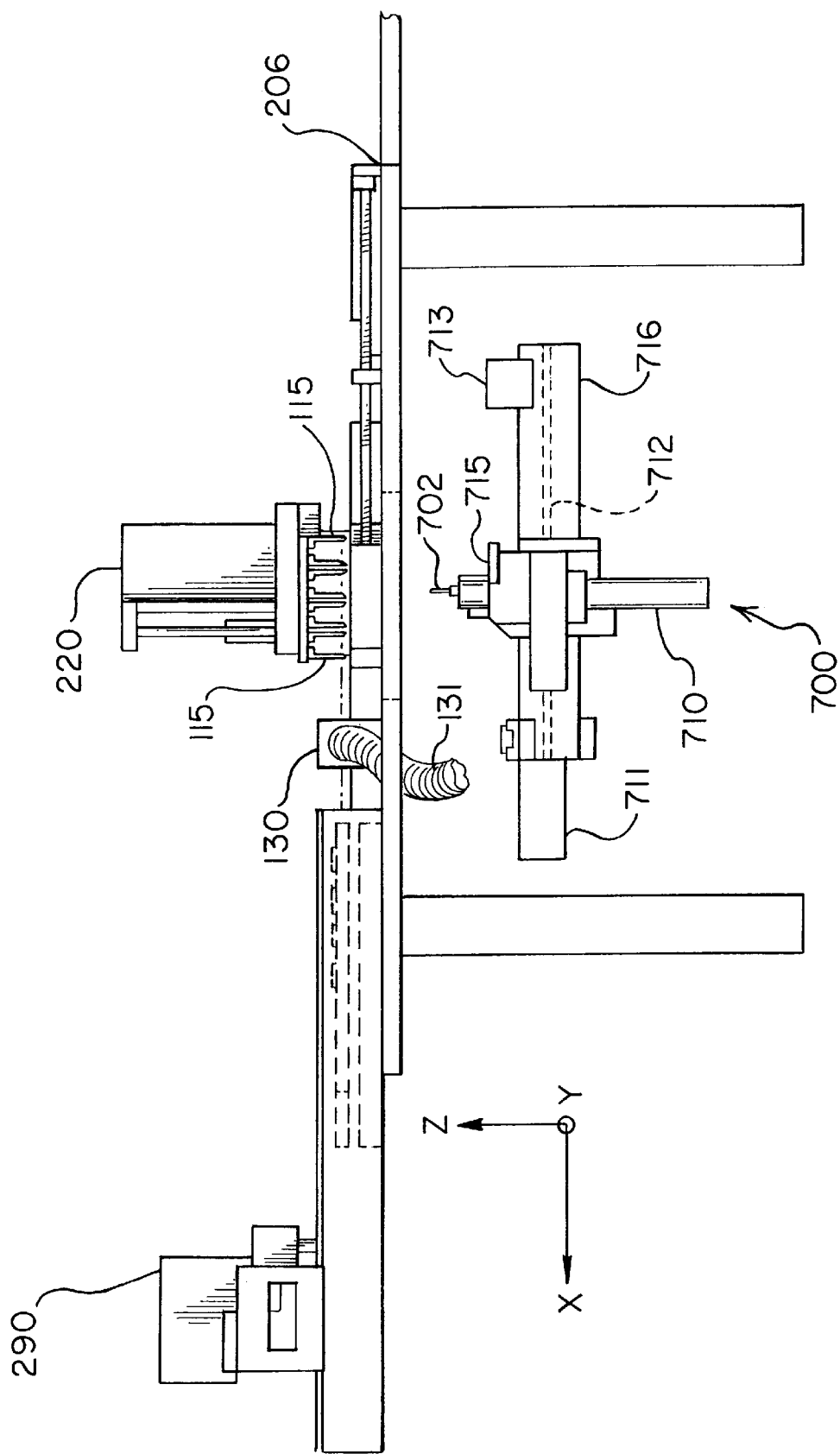
FIG. 7 illustrates a routing system for severing connections between the panel and the individual PC boards in the present invention.

Depaneling Subsystem 203—FIG. 7

The components of depaneling subsystem 203 are illustrated in FIG. 7. Router assembly 700 is mounted below table 206. Depaneler arm assembly 220 and pick and place arm assembly 290 are positioned on top of table 206. Router assembly 700 can move in all three axes. Pneumatic cylinder 710 operates in response to signals from controller 201 to move router head 715 up and down along the z axis. Motor 711 turns lead screw 712 in response to signals from controller 201 in order to cause router head 715 to along the x axis. Router head 715, motor 711 and lead screw 712 are mounted on frame 716. Motor 713 is connected to a lead screw (not shown) to move frame 716 and router head 715 along a y-axis in response to signals from controller 201.

In order for router 702 to cut all of the tabs 104 to depanel the PC boards, panel 100 is clamped into place by third walking clamp 228 and clamp 229 over an opening 299 as illustrated in FIG. 2. FIG. 2 also shows Depaneler arm assembly 220 on top of table 204. A base 224 is connected to guides 222 of depaneler arm assembly 220. A pneumatic cylinder 221 moves base 224 up and down along guides 222 responsive to signals from controller 201. Hand 226 extends out from base 224 over opening 299. Grippers 225 on the bottom of hand 226 has fingers 298 extending downwards towards opening 299.

When panel 100 is clamped into place controller 201 signals pneumatic cylinder 221 to move base 224 downwards towards opening 299. Fingers 298 of each gripper 225 are received by slots 109 on opposing sides of PC boards 101 to hold PC boards 101 in place after tabs 104 have been cut. Controller 201 signals routing assembly 700 to move in a programmed sequence to allow router 502 to cut all tabs 104 connecting PC board 101 to panel 101. As router 702 is cutting tabs 104, a primary vacuum (not shown) is moved over PC board 101 to remove debris caused by the cutting.

After all of the tabs 104 have been cut, controller 201 signals pneumatic cylinder 221 to move base 224 up guides 222. This moves grippers 225 holding PC boards 101 upward. Controller 201 transmits signals to the upper clamping members 213 and lower clamping members 212 of third walking clamp 228 to open and release panel 100 and to servo 261 to move third walking clamp 228 to receive another panel 100. After third walking clamp is moved, upper clamping member 212 and lower clamping member 213 of clamp 229 are opened and frame 103 is allowed to fall through opening 299. As third walking clamp 228 moves to receive another panel 100, movable receiving nest 240 receives the depaneled PC boards 101.

Movable Receiving nest 240—FIG. 8

FIG. 8 illustrates movable receiving nest 240 in a position 800 inside depaneling subsystem 203 to receive PC board 101 from grippers 225. Each compartment 241 in movable receiving nest 240 receives one PC board 101. Movable receiving nest 240 is mounted on platform 244. Platform 244 is, in turn, slidably mounted on lead screw 243. Motor 245 receives signals from controller 201 to turn lead screw 243 to move platform 244 between a first end and a second end of lead screw 243 which moves movable receiving nest 240 between position 800 and a position inside the registration subsystem 204 (depicted in FIG. 2).

Movable receiving nest 240 transports PC boards 101 from depaneling subsystem 203 to registration subsystem 204 in the following manner. Movable receiving nest 240 begins in the position depicted in FIG. 2. After third walking clamp 228 moves to receive another panel 100, controller 201 signals motor 245 to turn lead screw 243 to move movable receiving nest 240 into depaneling subsystem 203 directly under robotic hand 226 as illustrated in FIG. 8. After movable receiving nest 240 is in position 800, controller 201 signals pneumatic cylinder 221 to move hand 226 downwards by moving base 224 down guides 222. When grippers 225 of hand 226 reach a point that PC boards 101 are inside compartments 241, controller 201 signals pneumatic cylinder 221 to stop. The pneumatic motors (not shown) controlling fingers 298 of grippers 226 are then signaled by controller 201 to open. The openings of fingers 298 releases PC boards 101 into compartments 241. Controller 201 then signals pneumatic cylinder 221 to move base 224 upward to move grippers 225 out of movable receiving nest 240.

After grippers 225 have moved out of compartments 241, controller 201 signals motor 245 to turn lead screw 243 and move movable receiving nest 240 from the position 800 depicted in FIG. 8 to the position illustrated in FIG. 1. Depaneling subsystem 203 is then ready to receive and depanel another panel 100.

Movable receiving nest 240 passes through vacuum head 233 of secondary vacuum (not shown) as movable receiving nest 240 moves from position 800 to the position depicted in FIG. 1. Vacuum head 233 is substantially a cubic block with a substantially cubic opening 233 along it x-axis to allow receiving nest 240 to pass through head 233. Groove 233 allows the platform 244 to pass through vacuum head 233. An opening (not shown) the inside of vacuum head 233 is connected to tube 232 to provide an inlet for the secondary vacuum.

Controller 201 activates the secondary vacuum (not shown) that is connected to vacuum head 230 via tube 232 as movable receiving nest 240 passes through vacuum head 233. The secondary vacuum removes excess debris from PC boards 101 by causing air to flow into the secondary vacuum carrying the debris. After all of compartments 241 have passed through vacuum head 233, controller 201 signals the secondary vacuum to deactivate.

After movable receiving nest 240 has moved into registration subsystem 204, PC boards 101 are removed from movable receiving nest 240 by pick and place arm 291. FIG. 9 illustrates the components of registration subsystem 204.

Registration Subsystem 205—FIG. 9

FIG. 9 is a detailed view of registration subsystem 204 shown in FIG. 2. In FIG. 9, pick and place arm assembly 290 is illustrated in detail. Platform 295 spans from first leg 293 to second leg 294. First leg 293 and 294 are slidably mounted on guides 902 of rails 903. A pneumatic motor (not shown) moves first leg 293 and second leg 294 along guides 902. Base 297 is slidably mounted on platform 295 and is moved along platform 295 by a motor (not shown). Robotic hand 291 is attached to the bottom of base 297. Fingers 292 on robotic hand protrude downward from hand 291. Each finger 292 has pins (not shown) which are mated with holes 106 in PC boards 101 to grip PC boards 101.

Registration subsystem 204 provides PC boards 101 to a subsequent processing system in the following manner. After movable receiving nest 240 moves to the position illustrated in FIG. 2, controller 201 signals the pneumatic motor (not shown) to slide pick and place arm assembly along guides 902 to a position directly over movable receiving nest 240. Robotic hand 291 is then lowered by controller 201 to place the pins (not shown) of fingers 292 into the hole 106 of the PC boards 101 in compartments 241. Fingers 292 are then signaled to grip PC boards 101 and robotic hand 291 is raised by controller 201. Controller 201 then signals a motor (not shown) to move base 297 along platform 295 to position over receiving slots 906. Controller 201 lowers robotic hand 291 to cause PC boards 101 to be lowered into the receiving slots 906. Fingers 292 are then signaled to release PC boards 101. Controller 201 repeats this process until all of PC boards 201 are removed from movable receiving nest 240. After all PC boards 101 are removed from compartments 241, movable receiving nest 240 is ready to receive more PC boards 101 from depaneling subsystem 203.

SUMMARY

The above disclosed invention provides three subsystems that operate independently from one another. This allows each subsystem to perform its function independently from the functions of the other subsystems. The idle time of each system is decreased by the independent functions which in turn improves cycle time for system 100 to depanel PC boards 101. The above detailed description is a description of one possible exemplary embodiment of a system having improved cycle time for depaneling PC boards. It is envisioned that one skilled in the art can and will design a system for depaneling PC boards that infringes the present invention as claimed below either literally or through the Doctrine of Equivalents.

What is claimed is:

1. A system having increased cycle time for removing at least one PC board from a connected panel comprising:

a depaneling means for severing all connections between said at least one PC board and said panel;

first clamping means movable between a first position and a second position wherein said first position is proximate a feeder system and said second position is displaced from said first position and between said first position and said depaneling means, and oriented to fit along side a first side of said panel that receives a first corner of said first side of said panel from a previous processing station and clamps onto said first corner while in said first position;

second clamping means movable between a first position and a second position, wherein said first position of said second clamping means is proximate said second position of said first clamping means and said second position of said second clamping means is proximate said depaneling means, and oriented to fit along side a second side of said panel and to hold said second side of said panel;

a first motor that moves said first clamping means toward said depaneling means to said second position of said first clamping means wherein said second clamping means is along said second side of said panel and affixes to said second side of said panel;

a second motor for moving said second clamping means to said second position of said second clamping means to provide said panel to said depaneling means;

third clamping means movable between a receiving position outside of said depaneling means and a depaneling position inside said depaneling means and that is oriented to move along side said first side of said panel and affix to said first side of said panel;

a third motor for moving said third clamping means to said receiving position responsive to said depaneling means being ready to receive said panel and for moving said third clamping means to said depaneling position responsive to said third clamping means clamping said first side of said panel at said receiving position, wherein said first clamping means moves to a third position opposite said second position of said second clamping means, clamps said panel to hold said panel at said third position, unclamps said panel responsive to said third clamping means moving to said receiving position, and moves to said first position of said first clamping means responsive to said third clamping means moving to said receiving position.

2. The system of claim 1 wherein said first motor moves said first clamping means to said third position along side said panel when said second clamping means is in said second position and said first clamping means affixes to said first side of said panel to hold said panel in place.

3. The system of claim 1 further comprising:

means in said depaneling means for registering a position of said panel in said depaneling means.

4. The system of claim 1 wherein said first clamping means moves to said first position to clamp to a first corner of a subsequent panel responsive to said depaneling means receiving said panel.

* * * * *